United States Patent [19]

Takeuchi et al.

[11] Patent Number: 5,439,159

[45] Date of Patent: Aug. 8, 1995

[54] LEAD FRAME RETAINING APPARATUS

[75] Inventors: Takashi Takeuchi, Higashiyamato; Sugiura Kazuo, Akishima, both of Japan

[73] Assignee: Kabushiki Kaisha Shinkawa, Tokyo, Japan

[21] Appl. No.: 292,715

[22] Filed: Aug. 18, 1994

[30] Foreign Application Priority Data

Aug. 18, 1993 [JP] Japan .................. 5-223934

[51] Int. Cl.⁶ ............................. H01L 21/60
[52] U.S. Cl. .................. 228/49.5; 228/212; 437/220
[58] Field of Search .......... 228/6.2, 44.7, 47.1, 228/49.5, 180.21, 212; 269/903; 29/827; 219/56.21; 437/206, 220

[56] References Cited

U.S. PATENT DOCUMENTS 4,923,294  5/1990  Courtenay ................ 269/254.05
4,940,217  7/1990  Takeshita et al. ............ 269/50
5,181,646  1/1993  Ushiki ...................... 228/47.1
5,281,794  1/1994  Uehara et al. ................ 269/21

FOREIGN PATENT DOCUMENTS 4-30440   2/1992  Japan ................... H01L 21/60
4-74861  11/1992  Japan ................... H01L 21/60

Primary Examiner—Samuel M. Heinrich
Attorney, Agent, or Firm—Koda and Androlia

[57] ABSTRACT

A holding device of a frame retainer on a retainer holder used in bonding machines for manufacture of semiconductor devices including a pair retainer guides formed in the retainer holder so that the frame retainer is positionally secured between the retainer guides by positioning pins which are pushed and moved by spring members. The positioning pins are movable toward and away from the frame holder by turning (overcoming the spring force of the spring members) eccentric pins which are in contact with the positioning pins.

4 Claims, 3 Drawing Sheets

LEAD FRAME RETAINING APPARATUS

BACKGROUND OF THE INVENTION

1. Field of the Invention

The present invention relates to a lead frame retaining apparatus for retaining lead frames during the manufacture of semiconductor devices.

2. Prior Art

The apparatus disclosed in the Japanese Patent Application Publication (Kokoku) No. 4-74861 is one of the conventional lead frame retaining apparatuses.

In this apparatus, a frame retainer, that presses a lead frame against a heating block, is mounted in a detachable manner to a frame retainer holder by vacuum suction. When the frame retainer is held by the frame retainer holder by vacuum suction, the upper surface of the frame retainer is held (by means of vacuum suction) by the undersurface of the frame retainer holder. Positioning of the frame retainer in the length-wise direction is done using the inner side surfaces that are formed inside the undersurface of the frame retainer holder.

Thus, in this prior art, the upper surface of the frame retainer is held by the undersurface of the frame retainer holder by vacuum suction. Accordingly, if the vacuum is cut off as a result of, for example, vacuum system failure, the frame retainer will fall. In addition, since the frame retainer is held by the frame retainer holder via vacuum suction, the frame retainer is kept held for a short period of time after the vacuum has been cut. In this case, if the operator, believing that the vacuum is still on, operates the apparatus, the frame retainer falls.

Furthermore, the positioning of the frame retainer in the length-wise direction is accomplished using the inside side surfaces of the frame retainer holder. Thus, there are some more problems particularly when the frame retainer is replaced upon the change of the type of product being handled. In other words, the frame retainer suffers thermal expansion as a result of heat applied by the heating block; and if the thermal expansion occurs in the frame retainer, the frame retainer is tightly wedged in the frame retainer. If this happens, the frame retainer must be thoroughly cooled off before it is removed.

SUMMARY OF THE INVENTION

Accordingly, the object of the present invention is to provide a lead frame retaining apparatus which can prevent accidental falling of the frame retainer and allow an easy removal of the frame retainer even when a thermal expansion occurs in the frame retainer.

The object of the present invention is accomplished by a unique structure for a lead frame retaining apparatus in which a frame retainer is detachably mounted to a frame retainer holder. The frame retainer includes guide projections formed on both sides thereof and positioning cut outs formed at the guide elements. The frame retainer holder, on the other hand, includes retainer guides, which guide the guide projections of the frame retainer, and pin holes formed in the retainer guides so as to positionally correspond to the positioning cut outs of the frame retainer. The frame retainer holder further includes positioning pins provided in the pin holes so that the tip ends can come into the positioning cut outs of the frame retainer, spring members which urge the positioning pins toward the frame retainer, and eccentric pins which move the positioning pins along the axes of the pin holes of the frame retainer holder.

The frame retainer is mounted to the frame retainer holder in the following manner:

The guide projections of the frame retainer are first positioned on the retainer guides of the frame retainer holder, and the frame retainer is slid sideways so that the positioning cut outs of the frame retainer are aligned to the pin holes of the frame retainer holder. Then, the positioning pins are pushed by the spring members via the eccentric pins, resulting in that the positioning pins are entered into and engaged with the positioning cut outs of the frame retainer so as to positionally secure the frame retainer to the frame retainer holder.

Since the guide projections of the frame retainer are placed on the retainer guides of the frame retainer holder, the frame retainer will not fall. Furthermore, the frame retainer is positioned by the positioning pins that are in the positioning cut outs of the frame retainer, and these positioning pins are pressed against the frame retainer by the spring members. Accordingly, it is possible to design the frame retainer so that the length is shorter than the length of the frame retainer holder, leaving a gap between the frame retainer and the frame retainer holder. As a result, even when the thermal expansion occurs in the frame retainer, the frame retainer will not be tightly wedged in the frame retainer holder and can be removed easily.

Furthermore, by looking at the amount of protrusion of the positioning pins into the positioning cut outs of the frame retainer, it is possible to see whether or not the frame retainer is actually held in the frame retainer holder.

DETAILED DESCRIPTION OF THE INVENTION

One embodiment of the present invention will be described below with reference to FIGS. 1 through 4.

Figure 2:
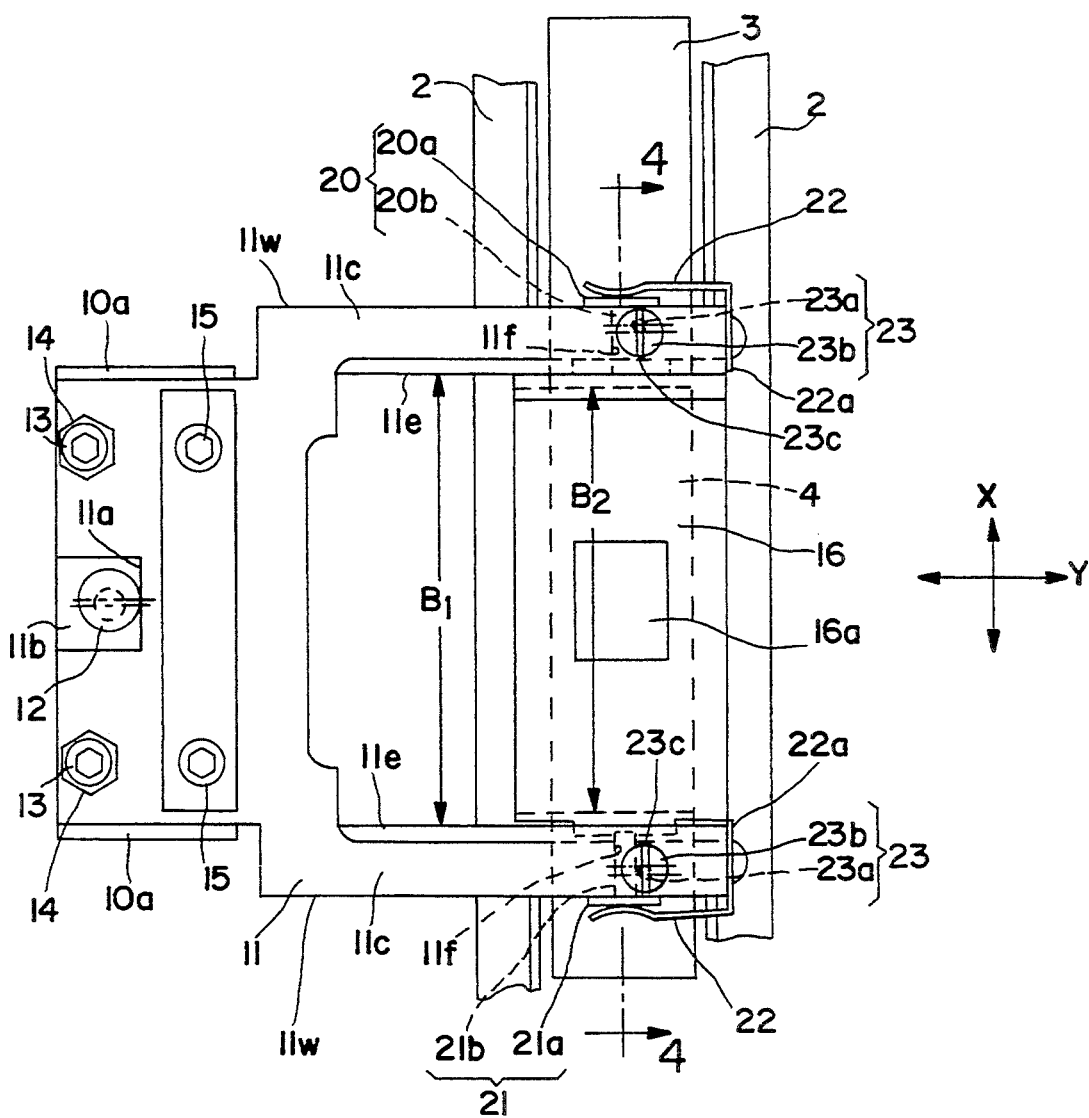
FIG. 2 is a top view thereof.
Figure 3:
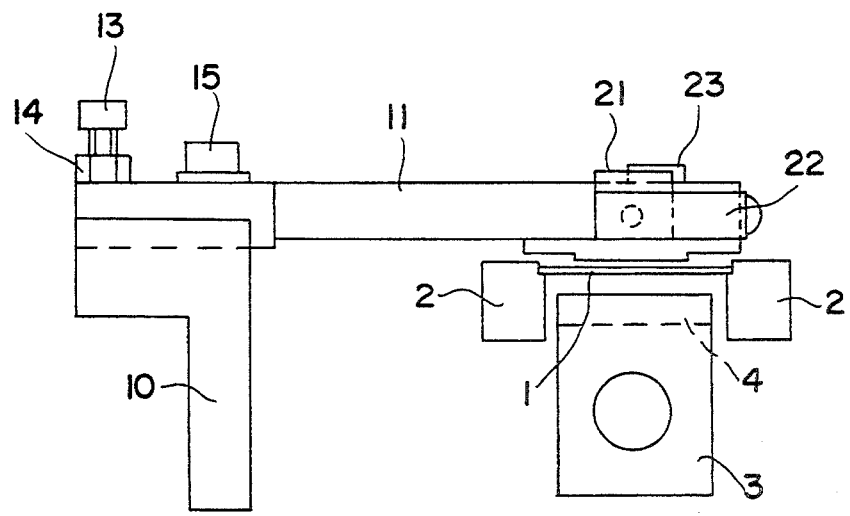
FIG. 3 is a front view of FIG. 2.
Figure 4:
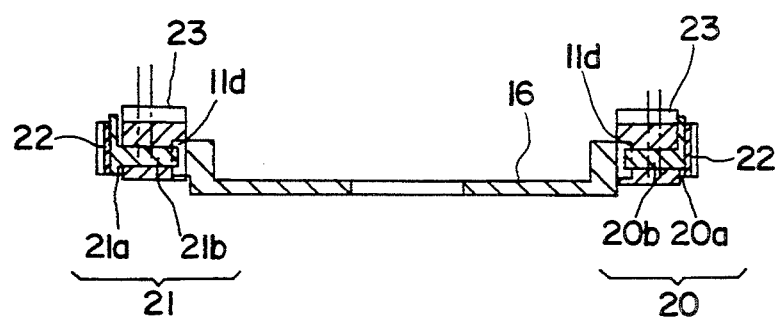
FIG. 4 is a cross section taken along the line 3—3 in FIG. 2.

As shown in FIGS. 2 and 3, a heating block 3 which is moved vertically by a vertical driving means (not shown) is installed between two guide rails 2, which guide a lead frame 1.

A heating bridge 4 is detachably attached to the heating block 3 in the bonding station area. The heating bridge 4 is used when there is a change in the type of lead frames to be handled. The attachment of the heating bridge 4 to the heating block 3 is accomplished by means of, for example, a vacuum suction system such as that described in the Japanese Patent Application Laid-Open (Kokai) No. 4-30440.

Figure 1:
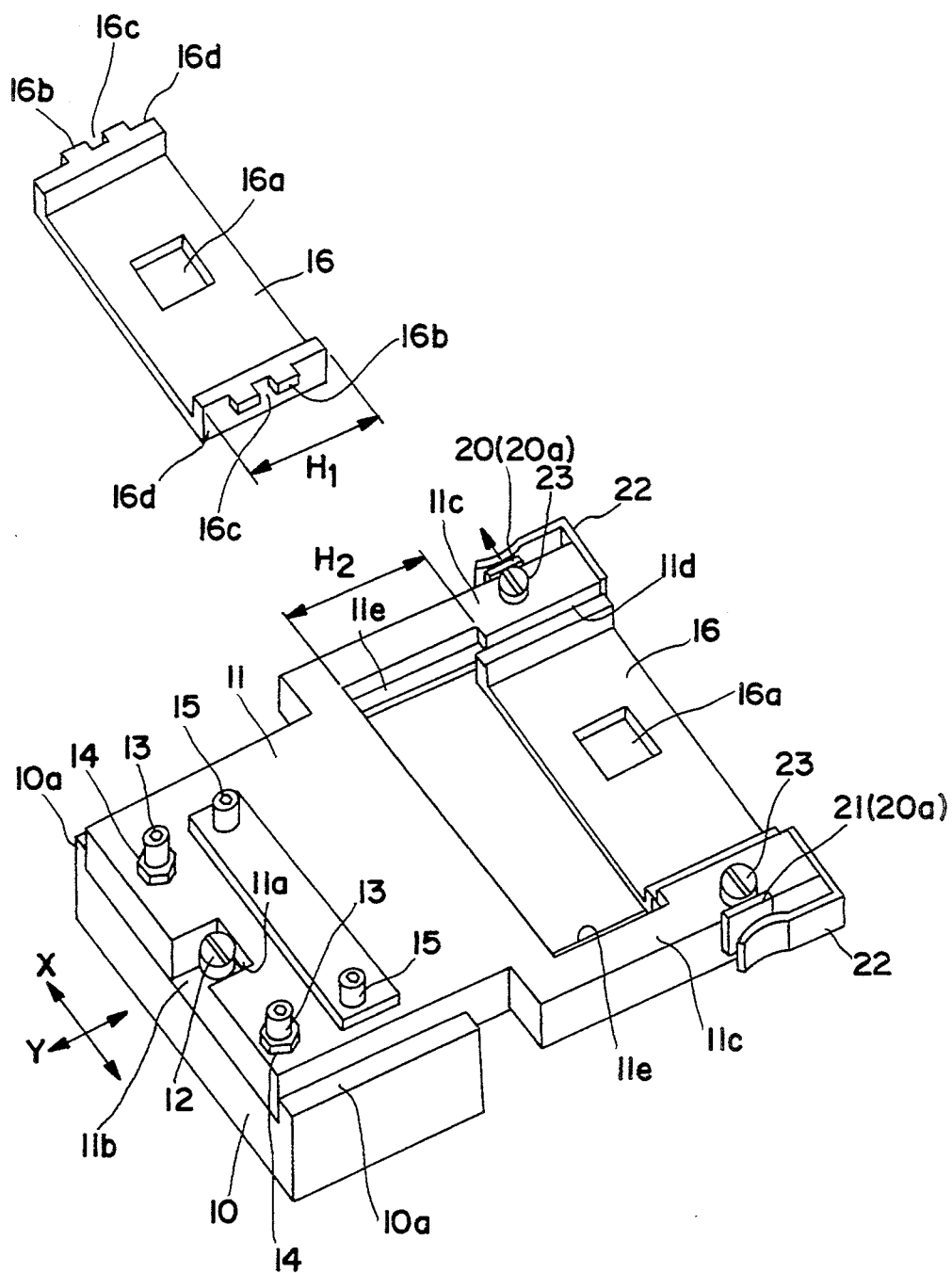
FIG. 1 is a perspective view of one embodiment of the lead frame retaining apparatus of the present invention.

A frame retainer holder attachment base 10 which can be moved vertically by a vertical driving means (not shown) is installed on one side of the guide rails 2 in the bonding station area. As shown in FIG. 1, positioning ridges 10a for positioning a frame retainer holder 11 in the X-direction (i.e., the direction in which the lead frame 1 is conveyed) are formed on both sides of the frame retainer holder attachment base 10. The positioning ridges 10a are formed so as to protrude upward. A first eccentric pin 12 used for Y-direction adjustment of the frame retainer holder 11 is provided in the frame retainer holder attachment base 10 in a rotatable fashion.

A frame retainer 16 is substantially rectangular in shape and has a bonding window 16a at the center. Guide projections 16b, which are to be inserted into retainer guides 11d of the frame retainer holder 11, project from both side walls 16d of the frame retainer 16. Positioning cut-outs 16c into which positioning pins 20 and 21 (described later) are snugly inserted are formed in the middle of the guide projections 16b.

As shown in FIGS. 1 through 4, the frame retainer holder 11 is installed on the frame retainer holder attachment base 10. The frame retainer holder 11 is in an angled C-shape when seen from above. The frame retainer holder 11 has a positioning surface 11a which comes into contact with the first eccentric pin 12. The positioning surface 11a is the end surface of a cut-out groove 11b formed in the frame retainer holder 11. In addition, the frame retainer holder 11 has level adjustment screws 13. These screws 13 are located on both sides of the cut-out groove 11b, and lock nuts 14 are screwed onto the level adjustment screws 13. The frame retainer holder 11 is installed on the frame retainer holder attachment base 10 by fastening screws 15.

The angled C-shaped frame retainer holder 11 has a pair of frame retainer holding sections 11c so that the frame retainer holding sections 11c face each other and extend above the heating block 3. Retainer guides 11d for guiding the side surfaces of a frame retainer 16 are formed on the inner surfaces of the frame retainer holding sections 11c.

The upper half of the inner sides of the retainer guides 11d are removed for the length $H_2$ which is greater than the width $H_1$ of the frame retainer 16, so that the lower half of the retainer guides 11d form frame retainer carrying surfaces 11e. The inside length $B_1$ of the frame retainer holding sections 11c is set longer than the length $B_2$ of the heating bridge 4.

The retainer guides 11d of the frame retainer holder 11 are provided with pin holes 11f through which the positioning pins 20 and 21 are inserted.

The positioning pins 20 and 21 consist of head portions 20a and 21a and the shank portions 20b and 21b, respectively. The shank portion 20b of the positioning pin 20 is designed so as to be short enough so that a slight gap can remain between the shank portion 20b and the bottom of the corresponding positioning cut out 16c of the frame retainer 16. On the other hand, the shank portion 21b of the positioning pin 21 is designed long enough so that the positioning pin 21 can push the frame retainer 16 toward the positioning pin 20.

L-shaped plate springs 22 are fastened to both end surfaces of the frame retainer holding sections 11c of the frame retainer holder 11 so that the plate springs 22 push the positioning pins 20 and 21 inwardly or toward the frame retainer 16. The end portions 22a of the plate springs 22 close the ends (the right hand ends in FIG. 2) of the retainer guides 11d of the frame retainer holder 11.

Second eccentric pins 23 are rotatably provided in the frame retainer holding section 11c of the frame retainer holder 11. The eccentric pins 23 are perpendicular to the positioning pins 20 and 21 and are kept in contact with the head portions 20a and 21a of the positioning pins 20 and 21. Each eccentric pin 23 has a flat edge 23c on the circumferential portion of the larger-diameter side 23b so that the flat edge 23c is positionally farthest from the smaller-diameter portion 23a.

The frame retainer 16 is mounted to the frame retainer holder 11 in the following manner:

The second eccentric pins 23 are first turned so that the flat edges 23c of the eccentric pins 23 are brought to contact with the head portions 20a and 21a of the positioning pins 20 and 21. This results in that the positioning pins 20 and 21 are moved outwardly against the spring force of the plate springs 22. Thus, the ends of the shank portions 20b and 21b of the positioning pins 20 and 21 are withdrawn from the retainer guides 11d of the frame retainer holder 11.

After this, the guide projections 16b of the frame retainer 16 are placed from above on the frame retainer carrying surfaces 11e of the frame retainer holder 11. Then, the frame retainer 16 is slid along the retainer guides 11d (toward the right in FIG. 1) so that the leading edge portions of the frame retainer 16 come into contact with the ends 22a of the plate springs 22.

After the frame retainer 16 has been thus moved, the second eccentric pins 23 are turned back to the original position which is as shown in FIG. 2 so that the positioning pins 20 and 21 are pushed inwardly by the spring member 22 towards the side walls 16d of the frame retainer 16. In this case, since the shank portion 20b of the positioning pin 20 is short, the end of the shank portion 20b of the positioning pin 20 is merely inside the positioning cut out 16c and not in contact with the side wall 16d of the frame retainer 16. However, since the shank portion 21b of the positioning pin 21 is long enough, the end of the shank portion 21b of the positioning pin 21 is not only inside the positioning cut out 16c but also in contact with the side wall 16d of the frame retainer 16. Thus, the frame retainer 16 is pressed only by the positioning pin 21.

In other words, the positioning of the frame retainer 16 in the X-direction is accomplished by the positioning pin 21 and by the retainer guide 11d which is located on the positioning pin 20 side of the frame retainer holder 11. The positioning of the frame retainer 16 in the Y-direction, on the other hand, is accomplished by the positioning pins 20 and 21 that are entered snugly into the positioning cut outs 16c of the frame retainer 16.

In the meantime, the frame retainer 16 is a component for pressing the lead frame 1 against the heating block 3. Accordingly, when the frame retainer 16 pushes down the lead frame 1, the frame retainer 16 is pressed against the upper surfaces of the retainer guides 11d of the frame retainer holder 11. In other words, the positioning of the frame retainer 16 in the Z direction (or the vertical direction) is accomplished by the upper surfaces of the retainer guides 11d.

When the frame retainer 16 needs to be removed from the frame retainer holder 11, it is only necessary to take the reverse steps from what is described above.

In other words, the eccentric pins 23 are turned 180 degrees. This results in that the positioning pins 20 and 21 are moved outwardly by the flat edges 23c of the eccentric pins 23 that pushes the head portions 20a and 21a of the positioning pins 20 and 21, overcoming the spring force of the plate springs 22. Thus, the ends of the shank portions 20b and 21b of the positioning pins 20 and 21 come out of the positioning cut outs 16c of the frame retainer 16, thus releasing the snug engagements between the positioning cut outs 16d of the frame retainer 16 and the positioning pins 20 and 21. After the engagements of the positioning pins and the positioning cut outs have been thus released, the frame retainer 16 is slid on the frame retainer carrying surfaces 11ealong the retainer guide 11d (towards the left in FIG. 1) and then lifted so as to be taken out of the frame retainer holder 11.

The X-direction, Y-direction and level adjustments of the frame retainer 16 are made in the following manner. These adjustments are performed with the frame retainer 16 mounted on the frame retainer holder 11 and with the fastening screws 15 loosened. More specifically, the X-direction adjustment of the frame retainer 16 is made using the positioning sections 10a of the frame retainer holder attachment base 10 as a guide. The Y-direction adjustment of the frame retainer 16 is made by turning the eccentric pin 12. The evenness adjustment of the frame retainer 16 is made by turning the level adjustment screws 13.

The X-direction, Y-direction and level adjustments of the frame retainer 16 need to be done only once when the frame retainer holder 11 is mounted to the frame retainer holder attachment base 10. There is no need to perform these adjustments when the frame retainer 16 is replaced.

As seen from the above, the frame retainer 16 is mounted to the frame retainer holder 11 by extremely simple steps which are essentially first putting the frame retainer 16 into the retainer guides 11d of the frame retainer holder 11 and then turning the second eccentric pins 23. The frame retainer 16 can be removed from the frame retainer holder 11 by merely turning back the second eccentric pins 23 and lifting the frame retainer 16 from the retainer guides 11d of the frame retainer holder 11.

Whether or not the frame retainer 16 has been in fact mounted to the frame retainer holder 11 can easily be confirmed by eyesight when looking at how deep the positioning pins 20 and 21 have been moved inwardly. In other words, the positions of the positioning pins 20 and 21 in FIG. 2 indicates that the frame retainer 16 is in fact securely mounted to the frame retainer holder 11. If the head portions 20a and 21a of the positioning pins 20 and 21 are not in contact with the outer wall surfaces 11w of the frame retainer retaining sections 11c, it indicates that the shank portions 20b and 21b of the positioning pins 20 and 21 are not inside the positioning cut outs 16c and that the frame holder 16 is not securely mounted to the frame retainer holder 11. Thus, the present invention has a high level of reliability.

The frame retainer 16 is positionally secured in the Z direction by the upper surfaces of the retainer guides 11d of the frame retainer holder 11, and the frame retainer 16 is supported by the carrying surfaces of the retainer guides 11d. Thus, the frame retainer 16 is kept prevented from falling.

The frame retainer 16 is positionally secured in the X-direction by the retainer guide 11d, and the frame retainer 16 is retained by being pushed by the plate spring 22 that is located on the positioning pin 21 side. Accordingly, it is possible to design the frame retainer 16 so that there is a gap between the side 16w of the frame retainer 16 and the inner surface of the retainer guide 11d. With this design, the thermal expansion occurred in the frame retainer 16 is absorbed by such a gap.

In addition, by forming the side length $B_1$ of the frame retainer holding sections 11c longer than the length $B_2$ of the heating bridge 4, it is possible to replace the heating bridge 4 by simply removing the frame retainer 16 from the frame retainer holder 11. Thus, the operating characteristics are extremely high.

As seen from the above, according to the present invention, the guide projections of the frame retainer are supported by the carrying surfaces of the retainer guides of the frame retainer holder. Accordingly, the frame retainer is prevented from falling. The frame retainer is positionally secured by the positioning pins engaged with the positioning cut outs of the frame retainer, and the positioning pins push the frame retainer via the plate springs. Accordingly, it is possible to have a gap between the frame retainer holder and the frame retainer. Thus, the frame retainer can easily be removed even when a thermal expansion occurs in the frame retainer. In addition, whether or not the frame retainer is securely mounted to the frame retainer holder can be easily confirmed by looking at the position of the positioning pins.

We claim:

1. A lead frame retaining apparatus comprising a frame retainer detachably mounted to a frame retainer holder, characterized in that:
    said frame retainer is provided with guide projections on both sides of said frame retainer, and positioning cut outs are formed in said guide projections; and
    said lead frame retainer holder is provided with retainer guides for guiding said guide projections of said frame retainer in the frame retainer holder, pin holes formed in said retainer guides at positions corresponding to said positioning cut outs of said frame retainer, positioning pins provided in said pin holes of said frame retainer holder so as to be able to enter into said positioning cut outs of said frame retainer, spring members which urge said positioning pins toward said frame retainer, and eccentric pins which move said positioning pins in a direction of said pin holes of said frame retainer holder.

2. A lead frame retaining apparatus according to claim 1, wherein an inner width of a portion of said frame retainer holder to which said frame retainer is positioned is set to be slightly greater than a length of a heating bridge which is detachably attached to a heating block.

3. A lead frame retaining apparatus comprising a frame retainer detachably mounted to a frame retainer holder, characterized in that:
    said frame retainer is substantially rectangular in shape and comprises:
        guide projections on both sides of said frame retainer, and
        positioning cut outs formed at the middle of said guide projections; and
    said lead frame retainer holder comprises:
        a pair of frame retainer holding sections provided so as to face each other,
        retainer guides for guiding said guide projections of said frame retainer in between, said retainer guides being formed on inner surfaces of said frame retainer holding sections;
        a pin hole opened horizontally in one of said pair of frame retainer holding sections at positions corresponding to said positioning cut outs of said frame retainer, a positioning pin installed in each one of said pair of pin holes so as to be able to engage with said positioning cut outs of said frame retainer, an eccentric pin provided vertically in each one of said pair of frame retainer holding sections, said eccentric pins being positioned so that said eccentric pins, when turned, move said positioning pins in an axial direction of said positioning pins, and a pair of spring members provided on said pair of frame retainer holding sections so as to press said positioning pins toward said frame retainer.

4. A frame retainer holding apparatus according to claim 3 further comprising an attachment base for mounting said frame retainer holder thereon via fastening means, said frame retainer holder being movable horizontally and vertically for a positioning purpose when said fastening means is loosened.

* * * * *